(12) United States Patent
Bayan et al.

(10) Patent No.: US 6,617,197 B1
(45) Date of Patent: Sep. 9, 2003

(54) MULTI ROW LEADLESS LEADFRAME PACKAGE

(75) Inventors: Jaime Bayan, Palo Alto, CA (US); Peter Howard Spalding, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/001,418

(22) Filed: Nov. 15, 2001

Related U.S. Application Data

(62) Division of application No. 09/766,037, filed on Jan. 18, 2001.

(51) Int. Cl.[7] .......................... H01L 21/44; H01L 21/50
(52) U.S. Cl. ........................................ 438/112; 438/123
(58) Field of Search ............................ 438/106, 107, 438/112, 123, 124, 127, 612, 613

(56) References Cited

U.S. PATENT DOCUMENTS

| | | | |
|---|---|---|---|
| 4,713,575 A | * 12/1987 | Knapp et al. | ............... 313/400 |
| 5,314,606 A | * 5/1994 | Irie et al. | ..................... 205/128 |
| 5,723,899 A | * 3/1998 | Shin | ............................ 257/666 |
| 6,031,292 A | 2/2000 | Murakami et al. | |
| 6,215,179 B1 | 4/2001 | Ohgiyama | |

* cited by examiner

Primary Examiner—Amir Zarabian
Assistant Examiner—Pamela Perkins
(74) Attorney, Agent, or Firm—Beyer Weaver & Thomas, LLP

(57) ABSTRACT

A packaging arrangement is described that utilizes a conductive panel (such as a leadless leadframe) as its base. The conductive panel has a matrix of device areas that each include a plurality of rows of contacts that are located outside of a die area. Tie bars provide support for the various contacts. Some of the tie bars are arranged to extend between adjacent contacts in the same row and some of the tie bars are arranged to extend diagonally between associated contacts in adjacent rows that are not adjacent one another. During packaging, the tie bars can be severed by cutting along lines (e.g. saw streets) that run adjacent the rows after a molding operation. The described panels are particularly useful in packages having three or more rows of contacts.

10 Claims, 6 Drawing Sheets

US 6,617,197 B1

MULTI ROW LEADLESS LEADFRAME PACKAGE

BACKGROUND OF THE INVENTION

The present invention relates generally to semiconductor packaging and more particularly to improved leadless leadframe based packaging.

A leadless leadframe package (LLP) is a relatively new integrated circuit package design that contemplates the use of a metal (typically copper) leadframe type substrate structure in the formation of the conductive elements of a package. As illustrated in FIG. 1, in typical leadless leadframe packages, a copper leadframe strip or panel 101 is patterned (typically by stamping or etching) to define a plurality of arrays 103 of chip substrate features 105. Each chip substrate feature 105 includes a die attach pad 107 and a plurality of contacts 109 disposed about their associated die attach pad 107. Very fine tie bars 111 are used to support the die attach pads 107 and contacts 109.

During assembly, dice are attached to the respective die attach pads and conventional wire bonding is used to electrically couple bond pads on each die to their associated contacts 109 on the leadframe strip 101. After the wire bonding, a plastic cap is molded over the top surface of the each array 103 of wire bonded dice. The wire bonded units are then singulated and tested using conventional sawing and testing techniques. During singulation, the tie bars 111 are cut and therefore the only materials holding the contacts 109 in place is the molding material. The resulting packaged chip can then be surface mounted on a printed circuit board or other substrate using conventional techniques.

Although leadless leadframe packaging has proven to be a cost-effective packaging arrangement, there are continuing efforts to further reduce the costs associated with packaging. Most existing leadless leadframe designs have only one or two rows of contacts 109. Accordingly additional and improved leadless leadframe designs that are particularly well suited for use in relatively high pin count devices would be desirable.

SUMMARY OF THE INVENTION

To achieve the foregoing and other objects and in accordance with the purpose of the present invention, a packaging arrangement is described that utilizes a conductive panel (such as a leadless leadframe) as its base. The conductive panel has a matrix of device areas that each include a plurality of rows of contacts that are located outside of a die area. Tie bars provide support for the various contacts. Some of the tie bars are arranged to extend between adjacent contacts in the same row and some of the tie bars are arranged to extend diagonally between associated contacts in adjacent rows that are not adjacent one another. With the described arrangement, during packaging, the tie bars can be severed by cutting along lines (e.g. saw streets) that run adjacent the rows after a molding operation.

In some preferred embodiments, the contacts in each device area are arranged at least three adjacent rows deep. The tie bars may have a thickness that is less than the thickness of the contacts, as for example about half the thickness of the contacts to make cutting easier. Methods of packaging integrated circuit devices using such conductive panels are also described.

DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
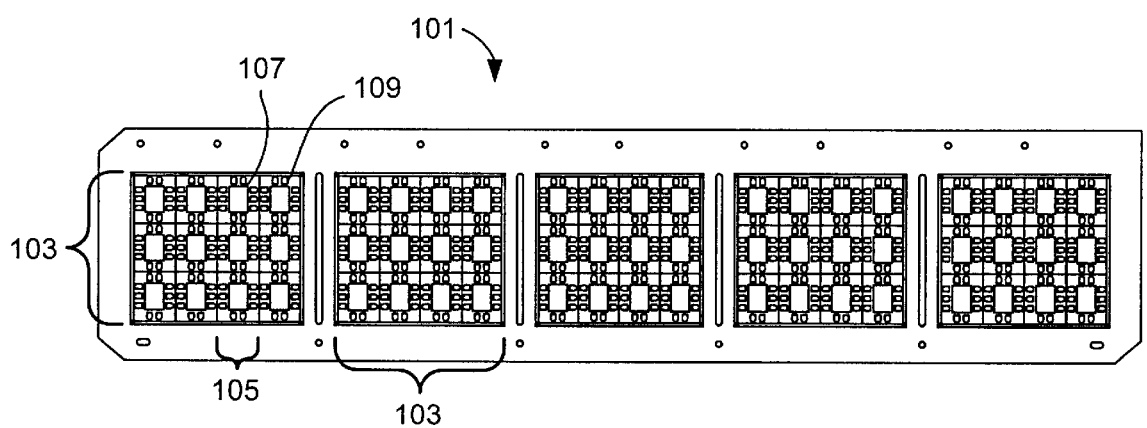
FIG. 1 is a diagrammatic top view of a conventional lead frame strip suitable for use in forming leadless leadframe packages.
Figure 2A:
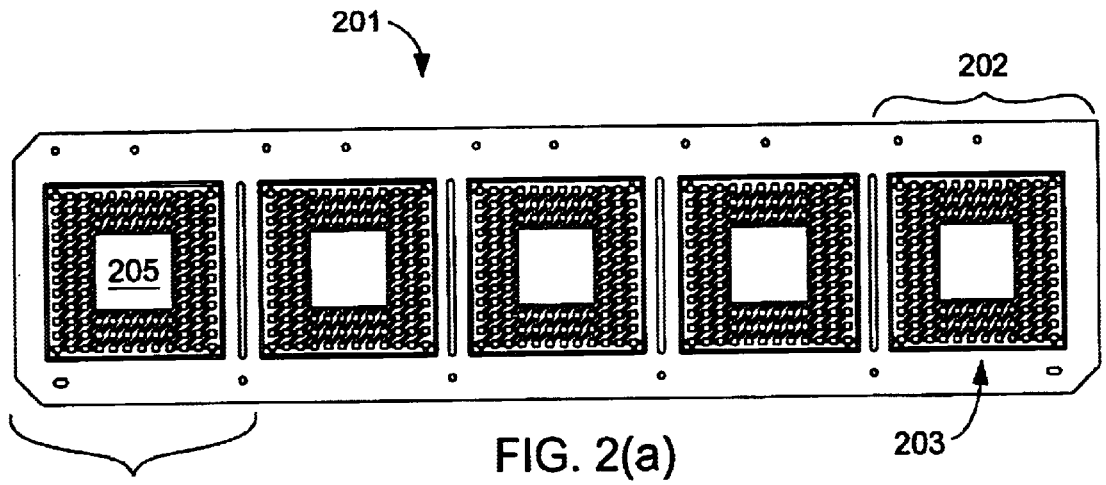
FIG. 2(a) is a diagrammatic top view of a conductive panel in accordance with one embodiment of the present invention.

Referring initially to FIG. 2(a) a leadless leadframe suitable for use in accordance with one embodiment of the present invention will be described. As seen therein, a conductive panel 201 is provided that has a plurality of segments 202 each having a device area 203 formed thereon. In the embodiment shown, the conductive panel takes the form of a leadframe strip having a one dimensional array of device areas 203. However, in alternative embodiments, conductive panels having a wide variety of different shapes (e.g. wider panels) and device area layouts (e.g. two dimensional arrays or blocks of two dimensional arrays) may be provided. In still other embodiments, each segment of a constructive strip or panel may have an array of device areas therein.

Figure 2B:
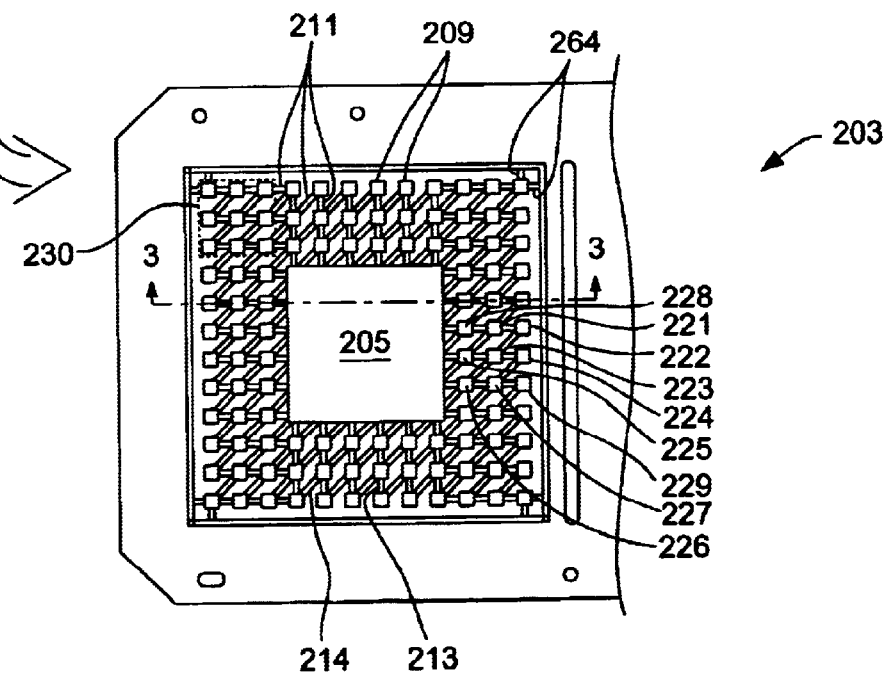
FIG. 2(b) is a diagrammatic top view of a portion of the conductive strip of FIG. 2(a) corresponding to a single device area in accordance with one embodiment of the present invention.

As best seen in FIG. 2(b), each device area 203 has a die attach pad 205 a plurality of rows of contacts 209 and a number of tie bars 211 that support the contacts 209. In the embodiment shown, three rows of contacts 209 are provided that circumscribe the die attach pad 209. In alternative embodiments, fewer or additional rows of contacts may be provided and the rows of contact do not necessarily need to extend around each side of the die.

The tie bars 211 include some bars 213 that extend perpendicularly between adjacent contacts in adjacent rows, and some bars 214 that extend diagonally between contacts in adjacent rows. The tie bars 211 are organized such that they can all be severed by cutting along saw lines 218 that run parallel to the rows of contacts 209 without traversing the die attach pad 205. This allows the tie bars to be removed easily during or after packaging thereby isolating the contacts.

For the purposes of explanation consider contact 223, which is located in a middle row to the side of die attach pad 205 in FIG. 2(b). Contact 223 has diagonally extending tie bars that couple it to diagonally positioned contacts 222 and 226 in the outer and inner rows respectively. Contact 223 also has perpendicularly extending tie bars that couple it to adjacent contacts 224 and 225 in the outer and inner rows respectively. It should be apparent that all four of the tie bars coupled to contact 223 can be severed simply by cutting along side the rows of contacts. It is particularly important to note that in the illustrated embodiment, contact 223 does not have tie bars that couple it to adjacent contact 221 and 227 in the same row. This is because such tie bars could not be severed by cutting along the rows of contacts. Rather, the cut would need to pass into the region of the die attach pad which (while possible) would require several more cutting passes and significantly extra care unless one is willing to cut through he die attach pad as well.

It should be appreciated that in theory, the contacts could be held in place only by tie bars that extend perpendicularly between adjacent rows (e.g., like the tie bars that extend from contacts 223 to contact 224 and 225 respectively. Although such an arrangement seem to work reasonably for devices having one or two rows of contacts, when three or more rows of contacts are provided, our experience has been that such structures often do not provide sufficient strength and rigidity to support the contacts in many situations. Therefore it is desirable to have a mechanism for providing additional rigidity, which is provided by the diagonally extending tie bars. In the embodiment shown, the tie bars extend diagonally in only one direction. However, it should be appreciated that the pattern of diagonally extending tie bars can be varied widely and that even crossing (X-shaped) arrangements may be appropriate in some circumstances. For example, in addition to diagonal tie bars extending from contact 223 to contacts 224 and 225, additional tie bars could be provided to connect to contacts 228 and 229.

It should be appreciated that contacts that are not positioned to a side of the die attach pad 205 can generally be supported by tie bars extending in any direction. That is, they can be supported by tie bars that extend perpendicularly between adjacent contacts in the same row, tie bars that extend perpendicularly between adjacent contacts in adjacent rows, and/or tie bars that extend diagonally between contacts in adjacent rows. This is because the tie bars would be cut in one of the sawing passes that are made along the various rows regardless of their orientation (as best understood be concurrently reviewing FIG. 5 which illustrates appropriate saw lines for the illustrated leadframe).

Figure 3:
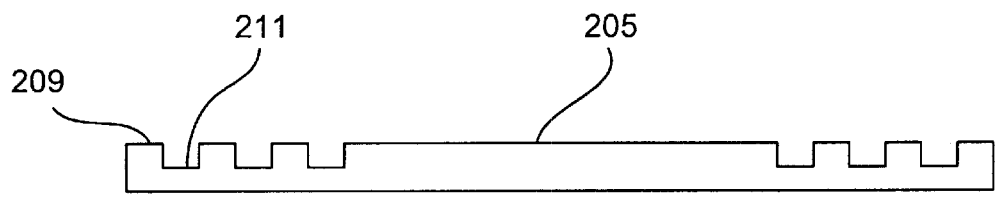
FIG. 3 is a diagrammatic cross sectional side view of the device area illustrated in FIG. 2(b) taken along line 3—3 of FIG. 2(b).

In order to make the sawing easier, the tie bars 211 may be reduced in thickness relative to the thickness of the contact 209 as best illustrated in FIG. 3. By way of example tie bar thicknesses in the range of about 30–70% (as for example, 50%) of the leadframe thickness have been found to work well for the tie bars. During production of the leadframe, the thickness of the tie bars can be reduced using conventional etching techniques. Preferably the top portion of the tie bars are removed as opposed to the bottoms portion in an effort to keep the required depth of the cuts relatively lower. It should be appreciated that if the cuts need to be deep enough to cut through the entire thickness of the leadframe, the likelihood of causing damage in the resulting package is increased.

Figure 4:
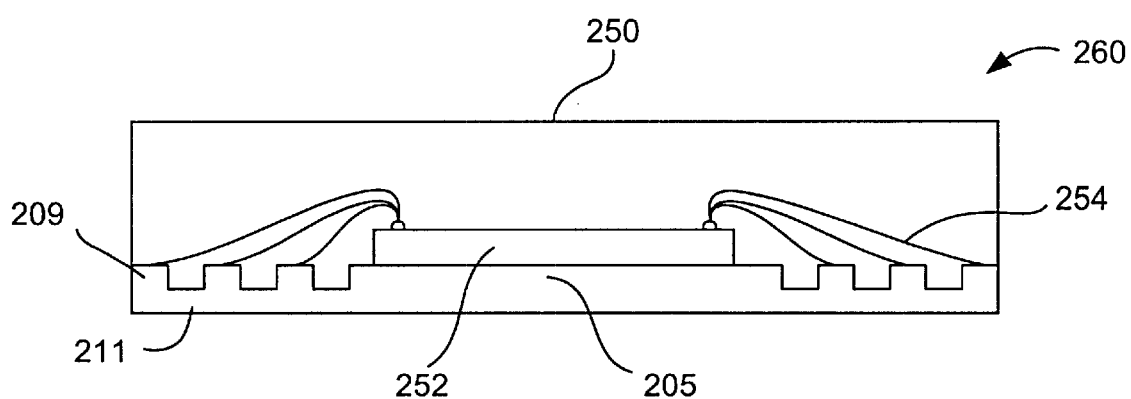
FIG. 4 is a diagrammatic cross sectional side view of the portion of the conductive strip illustrated in FIG. 2(b) after a molding operation but before the tie bars are severed.

The described leadframes can be used to package a wide variety of devices using relatively conventional steps. Generally, an appropriate die will be adhered to each die attach pad 205 in the leadframe panel or strip 201. If it is desired, the die attach pad can be thinned during thinning of the tie bars to provide a lower profile package. Bond pads on the dice are then electrically connected to their associated contacts 209 using conventional techniques such as wire bonding. After the wire bonding (or alternative means of electrically connecting the bond pads to the contacts), a molding operation is preformed to provide a molded plastic cap. As best illustrated in FIG. 4, the cap 250 covers the die 252, encapsulates the bonding wires 254, and covers the contacts 209 while leaving the bottom surface of the contacts exposed to form external contacts for the package 260. At this point the contacts remain electrically connected via the tie bars 211.

Figure 5:
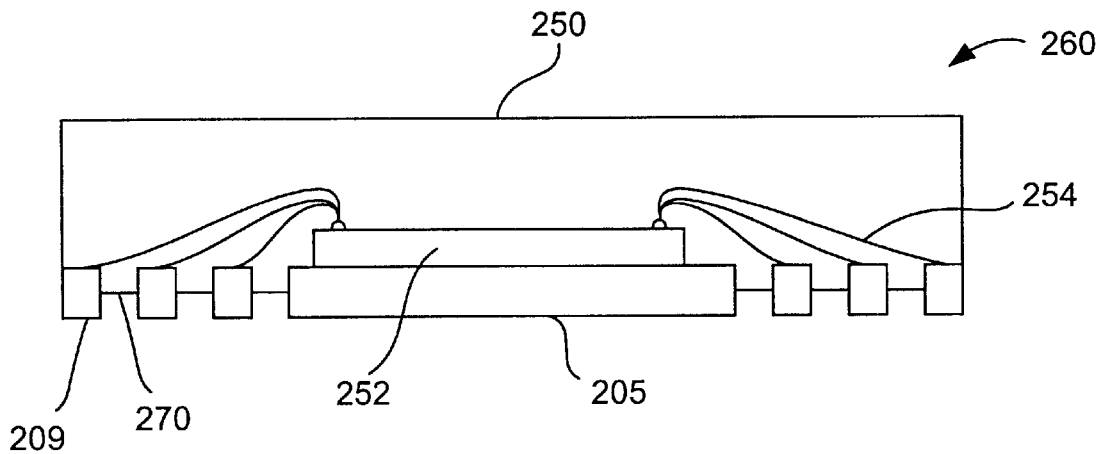
FIG. 5 is a diagrammatic cross sectional side view of the portion of the conductive strip illustrated in FIG. 4 after the tie bars are severed and highlighting the saw paths.

After the cap has been applied, the tie bars can be severed by cutting along saw lines 270 that extend along rows of the contacts as best illustrated in FIG. 5. The saw lines are intended to sever each of the tie bars 211. In the unlikely event that there is a reason to electrically couple two adjacent contacts, this can be done by positioning a tie bar between such contacts in a manner that would not be cut during the sawing operations. In the embodiment shown, the device area is only supported by corner support bars 264 (illustrated in FIG. 2(b). It should be appreciated that further support can be provided by adding more tie bars (not shown) that couple more (or all) of the outer contacts to the surrounding support. These peripheral tie bars may be removed by cutting along the outside of the outer row of contacts 209 or they may be severed during singulation of the packaged devices 260. The primary drawback to the latter approach is the cosmetic appearance of the resulting package which would have runners that extend to the side of the package from all (or many) of the outer row of contacts.

Figure 6:
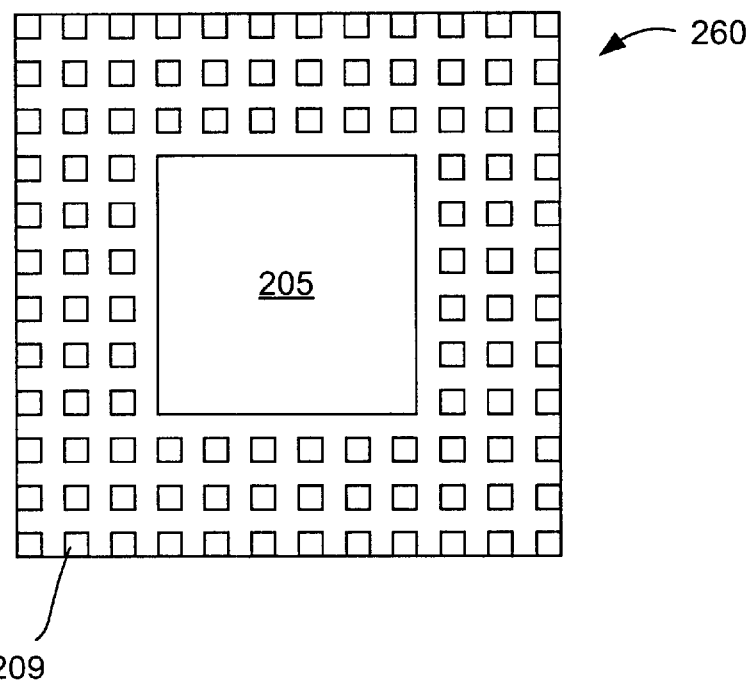
FIG. 6 is a diagrammatic bottom view of the portion of a device packaged in accordance with one embodiment of the present invention.

For functional reasons, there will often be no need to fill the cut lines 270. However, for cosmetic purposes it may be desirable to fill the cut lines. If desired, the cut lines can be filled with any suitable material such as epoxy. When the packaging is completed, the resulting package will have an appearance as illustrated in FIG. 6.

Figure 7A:
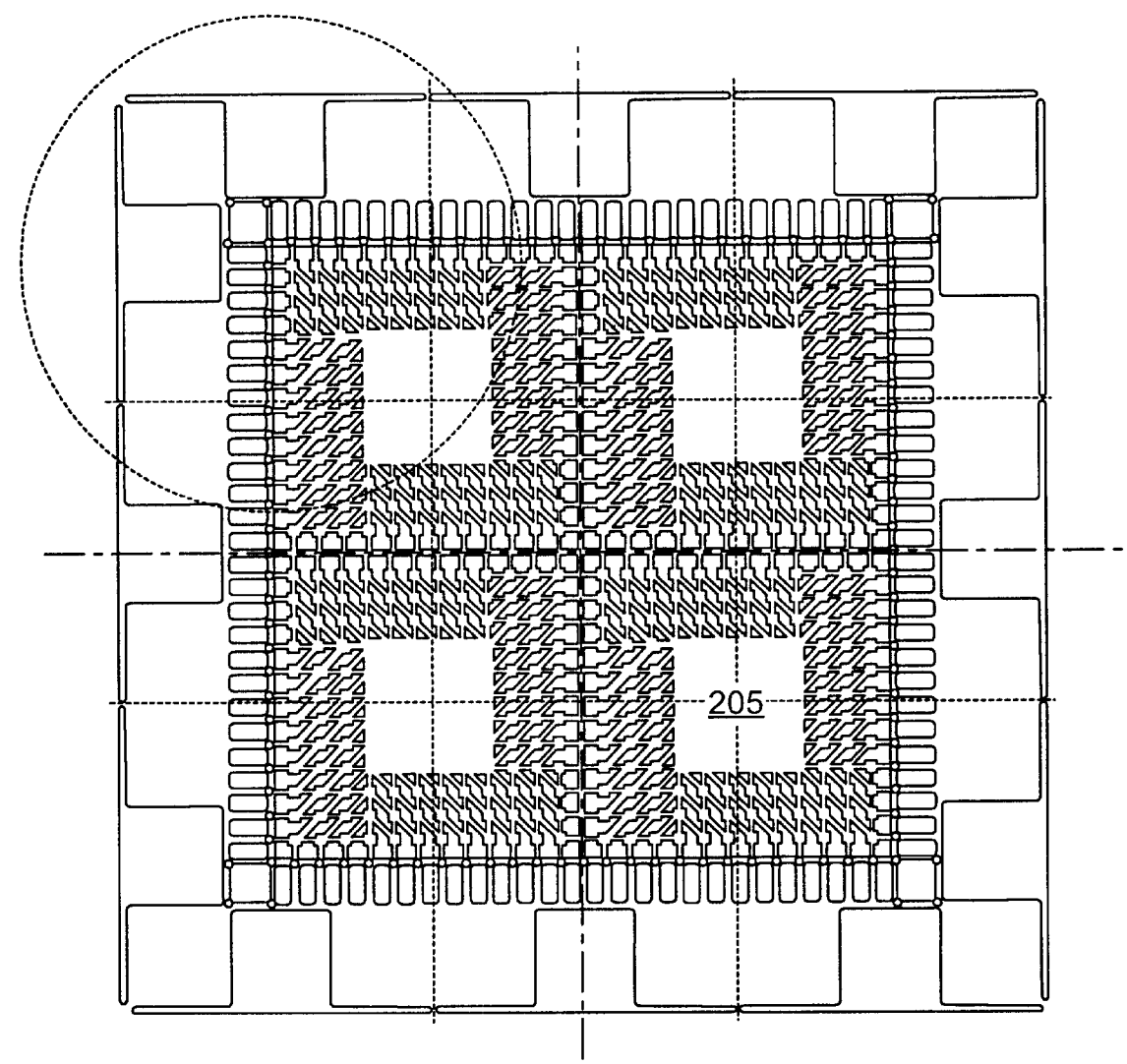
FIG. 7(a) is a diagrammatic top view of a segment of a conductive strip in accordance with another embodiment of the present invention.
Figure 7B:
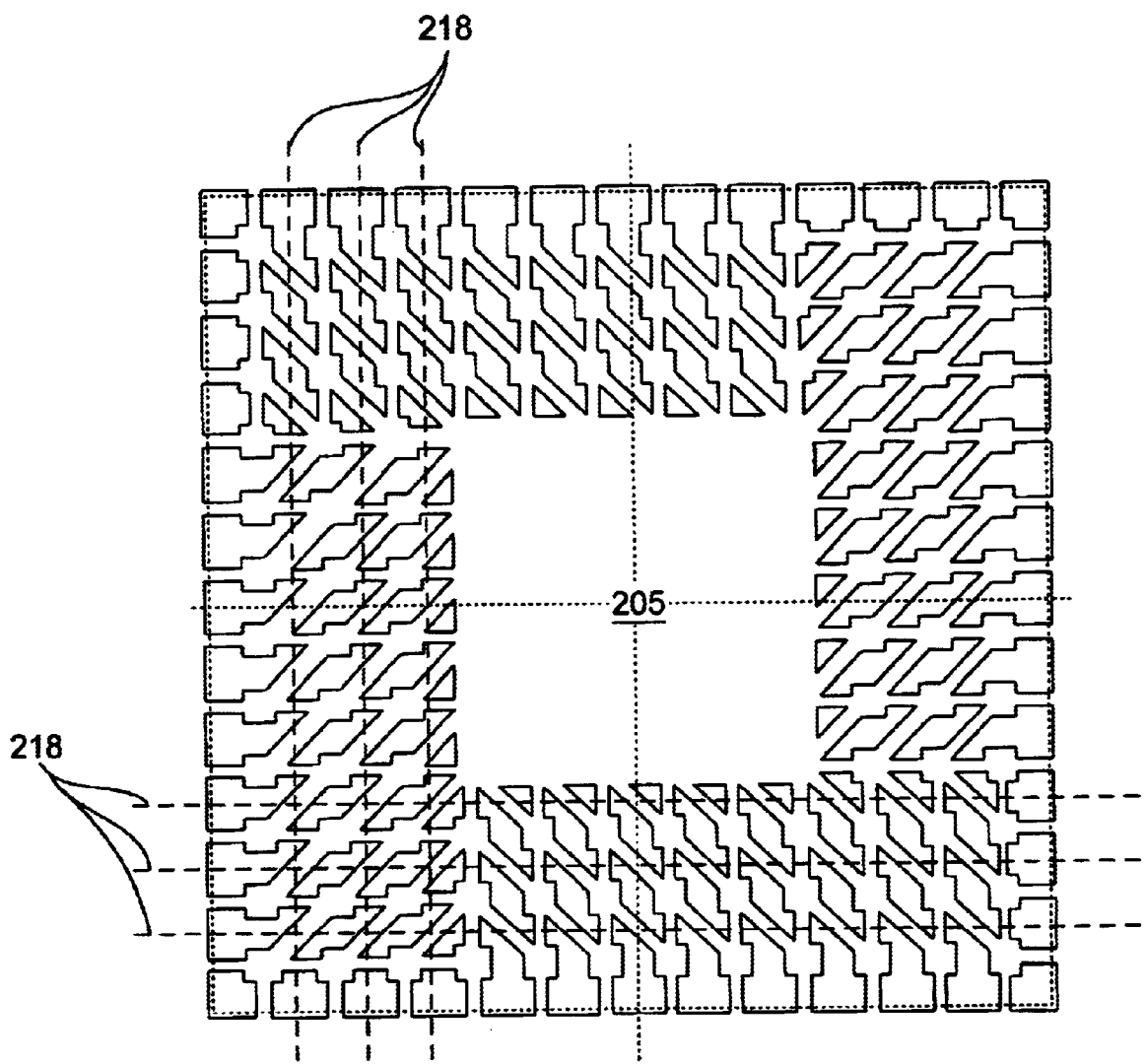
FIG. 7(b) is a diagrammatic top view of a portion of the conductive strip of FIG. 7(a) corresponding to a single device area in accordance with another embodiment of the present invention.

Referring next to FIGS. 7(a) and 7(b) another embodiment of the present invention is illustrated. This embodiment is very similar to the embodiment illustrated in FIGS. 2(a) and 2(b). However, in this embodiment, a plurality of devices areas are defined within each segment 102 of the leadframe strip. Also, in this embodiment tie bars are provided which couple each of the outer contacts to something in the surrounding support structure (i.e., an extended supporting tie bar).

Although only one embodiment of the present invention has been described, it should be understood that the present invention may be embodied in many other specific forms without departing from the spirit or scope of the invention. Particularly, although the invention has been described primarily in terms of devices having three uniform rows of contacts, it should be appreciated that the invention is equally applicable to devices having more or fewer rows and devices that have non-uniform contact spacing. The conductive panels have been described primarily in terms of copper leadframe strips, however again, the geometry of the panels, as well as the conductive materials that they are made from may be widely varied. Therefore, the present examples are to be considered as illustrative and not restrictive, and the invention is not to be limited to the details given herein, but may be modified within the scope of the appended claims.

What is claimed is:

1. A method of packaging integrated circuits comprising:

providing a lead frame panel having at least one matrix of device areas formed thereon, wherein at least some of the device areas include a die attach pad, a plurality of rows of contacts that are located about the die attach pad, and a multiplicity of tie bars that provide support for the contacts, wherein some of the tie bars are arranged to extend between adjacent contacts in the same row and some of the tie bars are arranged to extend diagonally between associated contacts in adjacent rows;

attaching a die to each die attach pad;

electrically connecting bond pads on the dice to associated contacts;

molding one or more plastic caps over the integrated circuit dice and the contacts thereby encapsulating the bonding wires, wherein the one or more caps are molded such that the bottom surface of the contacts remain exposed to facilitate electrical connection to external devices and the one or more caps substantially completely cover the top surfaces of the contacts; and cutting along lines that run adjacent the rows of contacts to sever the tie bars after the molding operation.

2. A method as recited in claim 1 further comprising singulating the panel to form a multiplicity of packaged integrated circuit devices.

3. A method as recited in claim 2 wherein the cutting is only done along extended rows of contacts.

4. A method as recited in claim 1 wherein a saw is used to cut the tie bars.

5. A method as recited in claim 1 wherein an etching operation is used to cut the tie bars.

6. A method as recited in claim 1 wherein the cuts electrically isolate the contacts to facilitate testing packaged integrated circuit devices in panel form.

7. A method as recited in claim 1 wherein some of the tie bars extend between associated contacts and the die attach pad thereby supporting the die attach pad and the cutting step also electrically isolates the die attach pad from the contacts.

8. A method of packaging integrated circuits comprising:

providing a lead frame panel having at least one matrix of device areas formed thereon, each device area including a die attach pad, a plurality of rows of contacts that are located about the die attach pad such that multiple rows of contacts are positioned on the same side of the die attach pad, and a multiplicity of tie bars that provide support for the contacts, wherein some of the tie bars are arranged to extend between adjacent contacts in the same row and some of the tie bars are arranged to extend diagonally between associated contacts in adjacent rows;

attaching a die to each die attach pad in the lead frame panel;

electrically connecting bond pads on the dice to associated contacts;

molding a plastic cap over the matrix of integrated circuit dice and the contacts thereby encapsulating the bonding wires, wherein the cap is molded such that the bottom surface of the contacts remain exposed to facilitate electrical connection to external devices and the cap substantially completely covers the top surface of the contacts and the cap is capable of holding the contacts in place;

along lines that run adjacent the rows of contacts to sever the tie bars after the molding operation without singulating the device areas, thereby electrically isolating the contacts;

testing the integrated circuits in panel form after the tie bars have been cut; and singulating the panel to form a multiplicity of packaged integrated circuit devices, whereby a multiplicity of packaged integrated circuit are formed that each have a plurality of rows of contacts positioned around the die attach pad.

9. A method as recited in claim 8 wherein the panel is arranged such that at least some of the device areas have three rows of contacts on at least one side of the associated die attach pad.

10. A method as recited in claim 8 wherein some of the tie bars extend between associated contacts and the die attach pad thereby supporting the die attach pad and the cutting step also electrically isolates the die attach pad from the contacts.

* * * * *

UNITED STATES PATENT AND TRADEMARK OFFICE
CERTIFICATE OF CORRECTION

PATENT NO.    : 6,617,197 B1
DATED         : September 9, 2003
INVENTOR(S)   : Bayan et al.

It is certified that error appears in the above-identified patent and that said Letters Patent is hereby corrected as shown below:

<u>Column 6,</u>
Line 27, insert the word -- cutting -- before the word "along".

Signed and Sealed this

Sixth Day of July, 2004

JON W. DUDAS
*Acting Director of the United States Patent and Trademark Office*